United States Patent
Galbiati

(10) Patent No.: US 10,033,191 B2
(45) Date of Patent: Jul. 24, 2018

(54) SYSTEM OF POWER GENERATION

(71) Applicant: SOLARIS PHOTONICS LTD, London (GB)

(72) Inventor: Arnaldo Galbiati, London (GB)

(73) Assignee: SOLARIS PHOTONOICS LTD, London (GB)

( * ) Notice: Subject to any disclaimer, the term of this patent is extended or adjusted under 35 U.S.C. 154(b) by 115 days.

(21) Appl. No.: 15/242,715

(22) Filed: Aug. 22, 2016

(65) Prior Publication Data

US 2017/0110879 A1    Apr. 20, 2017

(30) Foreign Application Priority Data

Oct. 14, 2015  (GB) .................... 1518185.2

(51) Int. Cl.
| | | |
|---|---|---|
| H02J 7/35 | (2006.01) | |
| H02J 3/38 | (2006.01) | |
| H02S 40/38 | (2014.01) | |
| H02S 40/34 | (2014.01) | |

(52) U.S. Cl.
CPC ............... *H02J 3/383* (2013.01); *H02J 7/35* (2013.01); *H02S 40/34* (2014.12); *H02S 40/38* (2014.12)

(58) Field of Classification Search
CPC .. H02J 7/35; H02J 3/383; H02S 40/38; H02S 40/34
See application file for complete search history.

(56) References Cited

U.S. PATENT DOCUMENTS

| | | |
|---|---|---|
| 2,780,765 A | 2/1957 | Chapin et al. |
| 4,529,832 A | 7/1985 | Sher et al. |
| 6,081,017 A | 6/2000 | Kim et al. |
| 2007/0204899 A1 | 9/2007 | Boyd |
| 2008/0236648 A1 | 10/2008 | Klein et al. |
| 2010/0126550 A1 | 5/2010 | Foss |
| 2012/0139349 A1 | 6/2012 | Fornage |
| 2012/0280571 A1 | 11/2012 | Hargis |
| 2013/0069438 A1 | 3/2013 | Liu et al. |
| 2013/0313900 A1 | 11/2013 | Charkin et al. |
| 2015/0263669 A1 | 9/2015 | Youn |

FOREIGN PATENT DOCUMENTS

| | | |
|---|---|---|
| CN | 103227475 | 7/2013 |
| EP | 2621047 A2 | 7/2013 |
| GB | 2468526 A | 9/2010 |
| GB | 2476508 A | 6/2011 |
| GB | 2513868 A | 11/2014 |
| KR | 20090128954 A | 12/2009 |

(Continued)

OTHER PUBLICATIONS

Combined Search and Examination Report under Sections 17 and 18(3) in relation to GB Patent Application No. 1518185.2 filed Oct. 14, 2015.

(Continued)

*Primary Examiner* — Robert Deberadinis
(74) *Attorney, Agent, or Firm* — Moore & Van Allen PLLC; Patrick B. Horne

(57) ABSTRACT

A power generation system (200) comprises a photovoltaic device (201) and a voltage source (202). The voltage source (202) is arranged to raise the bias voltage across the photovoltaic device (201), thereby increasing the power output of the power generation system (200).

13 Claims, 3 Drawing Sheets

(56) References Cited

FOREIGN PATENT DOCUMENTS

WO 2015127323 A1 8/2015

OTHER PUBLICATIONS

Chinese Patent Office; English translation of Office action and search report dated Aug. 21, 2017 for Chinese Application No. 201610685621.7.
Taiwan Patent Office; Office action and search report, with translation, dated Jun. 19, 2017 on Taiwanese Application No. TW105133000.
Chinese Patent Office; Office action and search report, with translation, dated Aug. 21, 2017 on Chinese Application No. 201610685621.7.
Notification of Transmittal of the International Search Report and the Written Opinion of the International Searching Authority, or the Declaration in International Application No. PCT/GB2016/053179 dated Dec. 9, 2016, 12 pages.

SYSTEM OF POWER GENERATION

TECHNICAL FIELD

The invention is concerned with power generation. Particularly, but not exclusively, the present invention relates to a system for increasing the power output of photovoltaic power generation systems.

BACKGROUND TO THE INVENTION

Electrical power generation and its subsequent use is ubiquitous in modern society. In many societies, so called "renewable" power generation technologies make up a large and growing proportion of the requisite power generation capacity. Renewable power generation technologies include, for example, photovoltaic power generation, wind power generation and tidal power generation.

Most renewable power generation systems are made up of discrete power generation blocks, typically connected in series or parallel. For example, in photovoltaic power generation, multiple photovoltaic cells may be connected together to provide a single output.

Photovoltaic cells are in essence light dependent solid-state rectifiers i.e.: photodiodes. When photons with a specific frequency strike a photovoltaic cell, electrons and holes are freed from the lattice and move towards the electrodes due to the internal electric field created by the intrinsic voltage bias. This voltage bias is normally between 0.5 and 0.7 V in conventional photovoltaic cells.

It is well known that the voltage produced in a photovoltaic cell is independent of the surface area of the photovoltaic cell (see for example U.S. Pat. No. 4,529,832). However, the current produced by a photovoltaic cell is proportional to the surface area of the photovoltaic cell. Whilst increasing the size of a photovoltaic cell will significantly increase its power output, there are practical and manufacturing difficulties in making ever larger photovoltaic cells. Therefore, power output is increased in photovoltaic power generation systems by connecting multiple photovoltaic cells together.

Typically, photovoltaic cells are connected together in either a series relationship or a parallel relationship. In photovoltaic systems where the cells are connected in series, the current is limited to that provided by an individual photovoltaic cell and the voltage is the sum of the voltages of each photovoltaic module in the system. This is reversed in photovoltaic systems where the cells are connected in parallel, i.e. the voltage is limited to that provided by an individual photovoltaic cell and the current is the sum of the currents of each photovoltaic module in the system.

At present the majority of photovoltaic power generation systems in use are based on series connected photovoltaic cells, a design originally developed by Chapin et al. (for example, U.S. Pat. No. 2,780,765). In such a system, the vast majority of the photovoltaic cells are needed only to produce a high voltage and do not contribute an increase in electrical current of the system. As the required output power increases and the photovoltaic system size increases, the amount area of the photovoltaic system producing a current in proportion to the incident light rapidly reduces. To illustrate this, the following example illustrates such a photovoltaic system arrangement:

The characteristics of a typical silicon photovoltaic cell are: 8.5 A maximum power current output, 0.5 V maximum power voltage output, for a surface area of 15.6×15.6 cm$^2$ (receiving 100 mW/cm$^2$ at air mass coefficient (AM) 1.5). Therefore, 72 of these photovoltaic cells must be connected in series to produce 36 V at maximum power point open circuit condition, whilst the current is constant at 8.5 A at short circuit condition maximum power point (equal to the value generated by a single photovoltaic cell). Thus, the actual area producing current in proportion to the amount of received light is just 1/72th of the photovoltaic system, whilst 71 out of the 72 photovoltaic cells occupy space only to generate voltage independently from the amount of light present.

The above example illustrates that significant surface area in prior art photovoltaic systems is not fully utilised. In many cases, the surface area available for renewable power generation is limited or there is no space in which to expand current installations. Therefore, there exists a clear need to increase the power output per unit area of renewable power generation systems. Even in cases where space is not a restriction, there is a clear advantage to being able to increase the power output per unit area.

SUMMARY OF THE INVENTION

In a first aspect, there is provided a power generation system comprising: a first photovoltaic device; and a voltage source coupled to the first photovoltaic device, wherein the voltage source is arranged to supply electrical power to the first photovoltaic device to increase the bias voltage of the first photovoltaic device thereby increasing the overall power output of the power generation system. An advantage of this novel arrangement is that the power output of photovoltaic devices can be greatly increased as compared to the prior art arrangement.

The voltage source may be arranged to maintain the bias voltage of the first photovoltaic device at a predetermined level. Maintaining the bias voltage at a predetermined level allows the power generation system to continue to operate at the increased power output level.

Preferably, the predetermined level is the bias voltage which maximises the power transfer of the power generation system. When the bias voltage is at a point which maximises the power transfer of the power generation system, the power generation system operates at optimum efficiency.

The voltage source may be arranged to reverse bias the first photovoltaic device. A reverse-biased photovoltaic device operates in the photocurrent mode and the width of the photovoltaic device depletion region increases with increasing reverse bias voltage.

Preferably, the power generation system further comprises a second photovoltaic device coupled to the voltage source, wherein the second photovoltaic device is arranged to supply electrical power to the voltage source. An advantage of including a second photovoltaic device, supplying power to the voltage source, is that the voltage source can be recharged if necessary.

The power generation system may further comprise a power regulator, coupled to the voltage source, wherein the power regulator is arranged to adjust the output power of the power generation system by adjusting the output of the voltage source. The power regulator enables the power generation system to adjust the output power of the power generation system as required.

The power regulator may be further arranged to monitor the power supplied to the voltage source from the second photovoltaic device. In this way, the power regulator is able to monitor the flow of power through the voltage source.

The power regulator may be further arranged to decrease the power output from the voltage source upon detecting that the power output from the voltage source is higher than the power supplied from the second photovoltaic device. In this way, the power regulator is able to adjust the output power of the voltage source to ensure that the capacity of the voltage source is not drained.

The power regulator may be further arranged to increase the power output from the voltage source upon detecting that the power output from the voltage source is lower than the power supplied from the second photovoltaic device. In this way, the power regulator is able to adjust the output power of the voltage source to ensure that the voltage source is not damaged from over-charging.

The power regulator may be further arranged to decrease the power output from the voltage source below the level of the power supplied from the second photovoltaic device upon detecting the voltage source needs to be charged. In this way, the power regulator is able to recharge the capacity of the voltage source.

The power regulator may be further arranged to increase the power output from the voltage source above the level of the power supplied from the second photovoltaic device upon detecting the voltage source is overcharged. In this way, the power regulator is able to discharge the capacity of the voltage source to provide a temporary increase in power output of the power generation system. Effectively, this allows power to be provided even when no light is available.

The voltage source may be located remotely from the first photovoltaic device and/or the second photovoltaic device. An advantage of the present invention is that voltage can be supplied to the power generation system from a voltage source has significantly less surface area than the equivalent combination of photovoltaic cells.

The power generation system may further comprise one or more diodes. The diodes may be coupled to any part of the power generation system. The one or more diodes are arranged to ensure that electrical current flows in only one direction in the power generation system and that the system current is restricted to a level that every component of the power generation system can handle.

The voltage source may be a battery or a battery with a capacitor in parallel connection with the battery, or any voltage source with a low internal resistance. Batteries and capacitors in parallel connection can provide a high voltage yet have low inherent electrical resistance, which increases the efficiency of the power generation system.

DESCRIPTION OF THE DRAWINGS

Some embodiments of systems in accordance with embodiments of the present invention are now described, by way of example only, and with reference to the accompanying drawings, in which.

DESCRIPTION OF EMBODIMENTS

It is noted that by connecting the photovoltaic elements of a photovoltaic power generation system in a parallel-relationship and providing an external voltage source, the power of the resultant power generation system per unit area can be greatly increased as compared to a current limited series connected photovoltaic power generation system. Furthermore, if the external voltage source is used to increase the bias voltage across each of the photovoltaic cells, the output current of the photovoltaic cells can be significantly increased. The term "parallel-relationship" as used herein preferably connotes positive and negative contact of a photovoltaic element in connection with respective positive and negative contact of one or more photovoltaic element.

Figure 1:
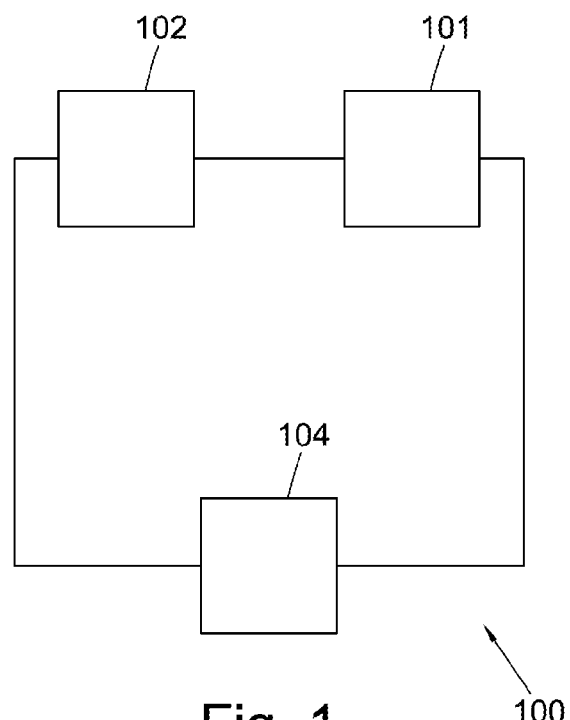
FIG. 1 is a schematic diagram of a prior art power generation system.

FIG. 1 illustrates a schematic diagram of a prior art photovoltaic power generation system 100. The power generation system 100 comprises a first photovoltaic device 101 and a second photovoltaic device 102. The first photovoltaic device 101 is connected in series to the second photovoltaic device 102. A first end of a load 104 is connected to the first photovoltaic device 101. A second end of the load 104 is connected to the second photovoltaic device 102, forming a complete circuit. The power generated by the photovoltaic devices 101 and 102 power the load 104.

Figure 2:
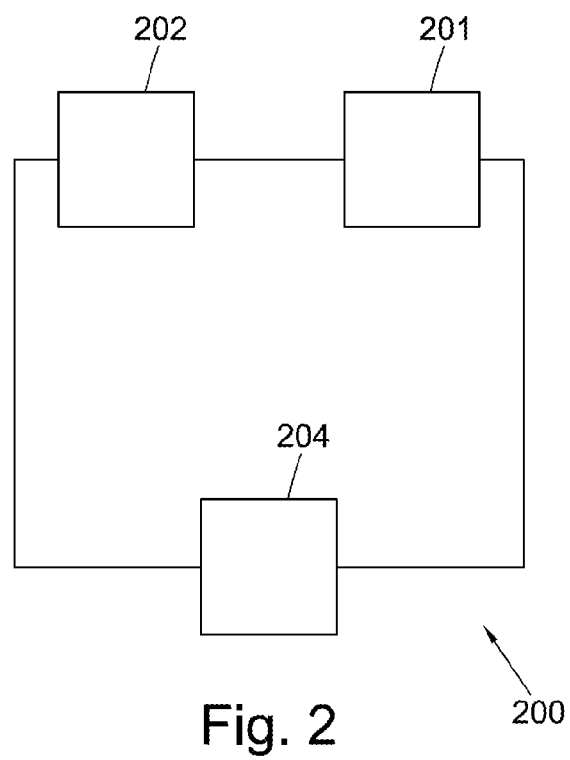
FIG. 2 is a schematic diagram of a power generation system in accordance with an embodiment of the present invention.

A first embodiment of the invention will now be described with reference to FIG. 2. FIG. 2 shows a schematic diagram of a power generation system 200. The skilled person will appreciate that the diagram is schematic and does not place any restrictions on the physical arrangement of the components. The power generation system 200 has a photovoltaic device 201. The photovoltaic device 201 comprises one or more photovoltaic cells (not shown). In one configuration, when the photovoltaic device 201 comprises two or more photovoltaic cells, the photovoltaic cells are connected in a parallel relationship. By connecting the photovoltaic cells in parallel the output current of the photovoltaic device 201 is the sum of the currents of each photovoltaic cell in the photovoltaic device 201. The skilled person will appreciate that the photovoltaic cells may also be connected in series, or any combination series-parallel thereof.

In the example embodiments described herein, the photovoltaic cells may be any suitable photovoltaic cells such as crystalline silicon photovoltaic cells, thin-film photovoltaic (such as amorphous silicon photovoltaic cells), Alkaline photovoltaic cells (see for example UK Patent Number GB2468526), Copper Indium Gallium Selenide (CIS/CIGS) photovoltaic cells, Cadmium Telluride (CdTe) photovoltaic cells, Gallium Arsenide photovoltaic cells, Indium Phosphide photovoltaic cells, Perovskite photovoltaic cells and the like.

The power generation system 200 also has a voltage source 202. In this example, the voltage source 202 comprises one or more batteries. The one or more batteries may be fabricated using any type of state of the art battery technology, such as Lead-Sulphuric Acid, Nickel-Metal Hydride, Sodium-Nickel, or Lithium-ion. When the voltage source 202 comprises two or more batteries, the batteries are connected in a series relationship (positive contact connected with negative contact) in order to provide the maximum amount of voltage per unit area and weight. The skilled person will appreciated that the batteries may also be connected in parallel, or any combination series-parallel thereof. Batteries are ideal as they can provide a high voltage and have a very low resistance. It would be possible to replace the one or more batteries with any other electrical component capable of providing a high voltage with a low resistance, such as a capacitor in parallel connection with a battery. However, the skilled person in the art will appreciate that any type of voltage source could also be used.

Whilst any voltage source could be used in examples of the system of the present invention described herein, preferably, the characteristics of the voltage source are selected to optimise the maximum power that can be extracted from the system. If we consider the maximum power transfer theorem (Jacobi's Law), maximum power from a system with a finite resistance occurs when the resistance of the load is equal to the resistance of the source, as viewed from the output terminals.

In the example embodiments described herein where the voltage source is a battery, the Ampere-Hours (AH) capacity of the battery is preferably equal to or more than 200% of the maximum output current of the power generation system 200. For example, for a 100 A maximum current in the power generation system 200, the AH capacity of the battery would be at least 400 AH.

Moreover, in the example embodiments described herein, there is no limit to the preferred voltage of the voltage source. Generally, the higher the voltage of the voltage source, the higher the resultant output power of the power generation system 200.

In the example embodiments described herein, the voltage source is arranged to provide a bias voltage across, at least one, photovoltaic device. The bias voltage extends the depletion region of the photovoltaic cells, and consequently reduces the capacitance of the photovoltaic cell. The extra active volume of the photovoltaic cells allows a linear increase of the generated photocurrent, as will be explained in more detail later in the description with reference to FIGS. 4 and 5. Preferably, the voltage source is further arranged to maintain the bias voltage at this increased, predetermined level. In the present example (where the voltage source provides 62.7 Volts), the predetermined level is preferably between 50 Volts and 70 Volts, more preferably between 55 Volts and 65 Volts, most preferably between 57 Volts and 63 Volts. The skilled person will appreciate, as set out in more detail later on, that the predetermined level is one which maximises the power transfer of the respective power generation system. Thus, the predetermined level will vary for each system according to the invention. In the current examples, the predetermined level is the voltage which corresponds to the current multiplication region labelled in FIGS. 3 and 4.

Additionally, the photovoltaic devices in the examples described herein, are reverse biased (i.e. operating in the photoconductive mode).

The voltage bias applied to each photovoltaic cell in the power generation system 200 changes dependent on the circuit voltage of the power generation system 200 (largely supplied by the voltage source 202) and the resistance of the load placed on the power generation system 200. I.e. the applied voltage bias increases as the circuit voltage increases and/or the resistance of the load decreases. Therefore, the output voltage of the voltage source 200 is selected dependent on the output power required from the power generation system.

The photovoltaic device 201 is coupled to the voltage source 202 and one side of a load 204. The voltage source 202 is coupled to the photovoltaic device 202 and the second side of the load 204. Therefore, in this arrangement the load 204 is arranged such that it can draw electrical power from the power generation system 200. The load 204 may be any suitable device such as an inverter, an electric motor or any other electrical device.

An advantage of this arrangement of the invention is that applying a bias voltage across a photovoltaic device can significantly increase the current output of the photovoltaic device. This in turn can significantly increase the power output of the power generation system 200.

The applicant recognises that in this arrangement of the invention, when voltage source 202 is a battery, a positive current generated by the photovoltaic device 201 enters the negative electrode of the battery, hence the battery is in a charging mode. It is noted that care must be taken in order not to overcharge the battery.

Figure 3:
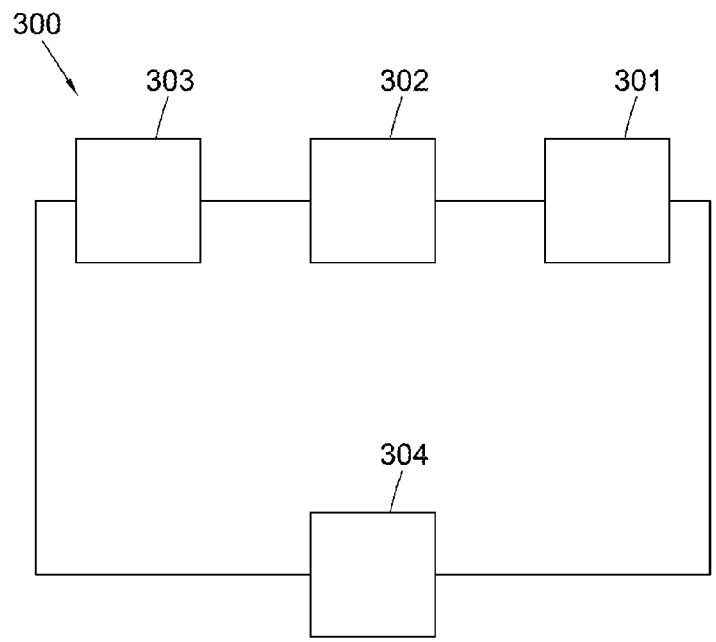
FIG. 3 is a schematic diagram of a power generation system in accordance with another embodiment of the present invention.

A second embodiment of the invention, capable of extended enhanced power generation, will now be described with reference to FIG. 3. FIG. 3 shows a schematic diagram of power generation system 300. The power generation system 300 has a first photovoltaic device 301. The first photovoltaic device 301 comprises one or more photovoltaic cells (not shown). In one configuration, when the first photovoltaic device 301 comprises two or more photovoltaic cells, the photovoltaic cells are connected in a parallel relationship. By connecting the photovoltaic cells in parallel the output current of the first photovoltaic device 301 is the sum of the currents of each photovoltaic cell in the first photovoltaic device 301. The skilled person will appreciate that the photovoltaic cells may also be connected in series, or any combination series-parallel thereof.

The power generation system 300 also has a voltage source 302. In this example, the voltage source 302 comprises one or more batteries. The one or more batteries may be fabricated using any type of state of the art battery technology, such as Lead-Sulphuric Acid, Nickel-Metal Hydride, Sodium-Nickel, or Lithium-ion. When the voltage source 302 comprises two or more batteries, the batteries are connected in a series relationship (negative contact connected with positive contact) in order to provide the maximum amount of voltage per unit area and weight. The skilled person will appreciated that the batteries may also be connected in parallel, or any combination series-parallel thereof. Batteries are ideal as they can provide a high voltage and have a very low resistance. It would be possible to replace the one or more batteries with any other electrical component capable of providing a high voltage with a low resistance, such as, for example, a capacitor.

The power generation system 300 also has a second photovoltaic device 303. The second photovoltaic device 303 comprises one or more photovoltaic cells. In this example, the electrical characteristics of the second photovoltaic device 303 are matched to the electrical characteristics of the first photovoltaic device 301. However, the skilled person would appreciate that the current characteristics of the photovoltaic devices 301 and 303 have to be matched in order to implement the invention, but that the voltage could be different. When the second photovoltaic device 303 comprises two or more photovoltaic cells (not shown), the photovoltaic cells are connected in a parallel relationship. By connecting the photovoltaic cells in parallel the output current of the second photovoltaic device 303 is the sum of the currents of each photovoltaic cell in the second photovoltaic device 303. The skilled person will appreciate that the photovoltaic cells may also be connected in series, or any combination series-parallel thereof.

The first photovoltaic device 301 is coupled to the voltage source 302 and one side of a load 304. The voltage source 302 is coupled to the first photovoltaic device 301 and the second photovoltaic device 303. The second photovoltaic device 303 is coupled to the voltage source 302 and the second side of the load 304. Therefore, in this arrangement the load 304 is arranged such that it can draw electrical power from the power generation system 300. The load 304 may be any suitable device such as an inverter, an electric motor or any other electrical device.

This arrangement of the power generation system 300 displays the following electrical characteristics:
  the Open Circuit Voltage $V_{oc}$ is the sum of the Open Circuit Voltage $V_{oc}$ of the first photovoltaic device 301, the voltage source 302 and the second photovoltaic device 303;
  the Short Circuit Current $I_{sc}$ of the system is equal to the characteristic Short Circuit Current $I_{sc}$ of one of the first photovoltaic device 301 or the second photovoltaic device 303 when measured alone.

The applicant has experimentally verified that a configuration of the invention as set out above, produces electrical power equivalent to the product of the series voltage multiplied by the current generated by the photovoltaic cells multiplied by a correction factor between 0.1 and 0.7 commonly known as a "Fill Factor" (FF), that is:

$$\text{Power} = V_{oc} * I_{sc} * FF$$

The characteristics of a first example power generation system in accordance with the embodiment described above in respect of FIG. 3 will now be described. In the first exemplar system, the first photovoltaic device 301 is fabricated from four large area silicon photovoltaic cells of size 15.6×15.6 cm$^2$ and the second photovoltaic device 303 is fabricated from four further identical large area silicon photovoltaic cells. Each large area silicon photovoltaic cell has the following typical electrical characteristics (under a 1000 W/m$^2$ light intensity):
  Cell Open Circuit Voltage $V_{oc}$=0.65 V;
  Cell Short Circuit Current $I_{sc}$=8.5 A.

When the four photovoltaic cells are connected in parallel to form the first photovoltaic device 301 and the four further photovoltaic cells are connected in parallel to form the second photovoltaic device 303 of the system, the photovoltaic devices 301 and 303 have the following electrical characteristics:
  Device Open Circuit Voltage $V_{oc}$=0.65 V;
  Device Short Circuit Current $I_{sc}$=34 A.

In this example, the voltage source 302 is a 48V battery with 120 Ampere-Hours (AH) capacity. When the first photovoltaic device 301 is coupled in series with voltage source 302 and the second photovoltaic device 303, the measured electrical characteristics of the system are:
  System Open Circuit Voltage $V_{oc}$=Device 301 Open Circuit Voltage $V_{oc}$ (0.65V)+voltage source 302 Open Circuit Voltage $V_{oc}$ (48V)+Device 303 Open Circuit Voltage Voc (0.65V)=49.3 V;
  Short Circuit Current $I_{sc}$ of the System=Device 301 Short Circuit Current $I_{sc}$ (34 A)=Device 303 Short Circuit Current $I_{sc}$(34 A)=34 A;
  The surface area of the system is given by the sum of the areas of the first photovoltaic device 301, the voltage source 302 and the second photovoltaic device 303. In this example the first photovoltaic device 301 and the second photovoltaic device 303 can be arranged to have a surface area of 0.10 m$^2$ each. The voltage source 302, using state of the art battery technology as an example, has a surface area of 0.8 m$^2$. Thus the total surface area of the system=0.10 m$^2$+0.8 m$^2$+0.10 m$^2$=1.0 m$^2$.

Therefore, the first example power generation system 300 has the following characteristics: System $V_{oc}$=49.3 V, $I_{sc}$=34 A, surface area=1 m$^2$.

Using a fill factor between 0.1 and 0.7, the generated power of the first example power generation system 300 is between 167 Watts per square meter (W/m$^2$) and 1173 W/m$^2$ respectively (under a 1000 W/m$^2$ light intensity).

In comparison, a commercial monocrystalline silicon photovoltaic module has the following characteristics:
  Silicon photovoltaic module (comprising 18 large area silicon photovoltaic cells of size 15.6×15.6 cm$^2$ in series, each cell having a $V_{oc}$=0.65V) $V_{oc}$=23.4 V, $I_{sc}$=8.5 A, area=1 m$^2$, with a fill factor of 0.72 this results in a typical generated power of around 143.2 W/m$^2$ (under a 1000 W/m$^2$ light intensity).

Therefore, the first example of the applicant's power generation system significantly improves the power generated per square meter as compared to the prior art system set out above. Moreover, the applicant recognises that the voltage source 302 does not require line of sight to the sun and can thus be mounted under the first and/or second photovoltaic devices 301 and 303, or in fact at a remote location, further reducing the required surface area of the system and consequently increasing the power generated per unit area.

As an example, in a domestic setting, typically photovoltaic devices are located on parts of the roof with preferential aspects with respect to the sun. In these cases, the surface area available for photovoltaic power generation is limited. In this case, the voltage source 302 may be mounted below the roof, for example in the attic or in fact any other remote location, maximising the surface area of the roof available for mounting photovoltaic devices.

The characteristics of a second example power generation system in accordance with the embodiment described above, will now be described in respect of FIGS. 1 and 3. In the second example, polycrystalline Silicon photovoltaic panels manufactured by Kyocera® (model number KD135SX) were used for both the first photovoltaic device 301 and the second photovoltaic device 303. Each photovoltaic panel from Kyocera® had a rated nominal peak power of 135 Watts (+/−5%).

To characterise the second example power generation system, the two Kyocera® photovoltaic panels (acting as the first photovoltaic device 101 and the second photovoltaic device 103 respectively) were connected in the prior art arrangement as seen in FIG. 1, and then connected to a current-voltage (I-V) curve tester suitable for photovoltaic generation systems.

The I-V curve tester was sourced from HT Instruments (model name HT PHOTOVOLTAIC I-V). The I-V curve tester is a standard reference device to measure the performance of photovoltaic systems. In practice it is a variable resistive load that measures the complete I-V curve and key parameters, such as: the Open Circuit Voltage ($V_{oc}$), Short Circuit Current ($I_{sc}$), Maximum Power Point Current ($I_{mpp}$), Maximum Power ($P_{max}$) and Maximum Power Point Voltage ($V_{mpp}$).

This prior art arrangement of the system, (i.e. series connected with no voltage source 302), gave the following values:
  $V_{oc}$=40.6 V;

$V_{mpp}$=33.0 V;
$I_{mpp}$=3.60 A;
$I_{sc}$=4.04 A;
$P_{max}$=119 W;
FF=0.72;
Power per meter squared under photovoltaic irradiation=405 W/m².

After this reference test, the power generation system of the second example was modified into the configuration of the present invention, as shown in FIG. 3, by introducing five 12.5 V Lead Acid batteries (with 44 AH capacity each, surface area 207×175×175 millimeters) as the voltage source 302. The batteries were connected in series with each other (producing a total voltage from the batteries of 62.7 V) and in series between the two Kyocera® panels acting as the first 301 and second 303 photovoltaic devices respectively. This second arrangement gave the following values for the power generation system:
$V_{oc}$=103.3 V;
$V_{mpp}$=57.1 V;
$I_{mpp}$=8.45 A;
$I_{sc}$=8.42 A;
$P_{max}$=483 W;
FF=0.55;
Power per meter squared under solar irradiation=402 W/m²;

It is evident from the above data that the maximum power ($P_{max}$) of the two comparison systems is significantly higher in the presently described inventive arrangement.

Figure 4:
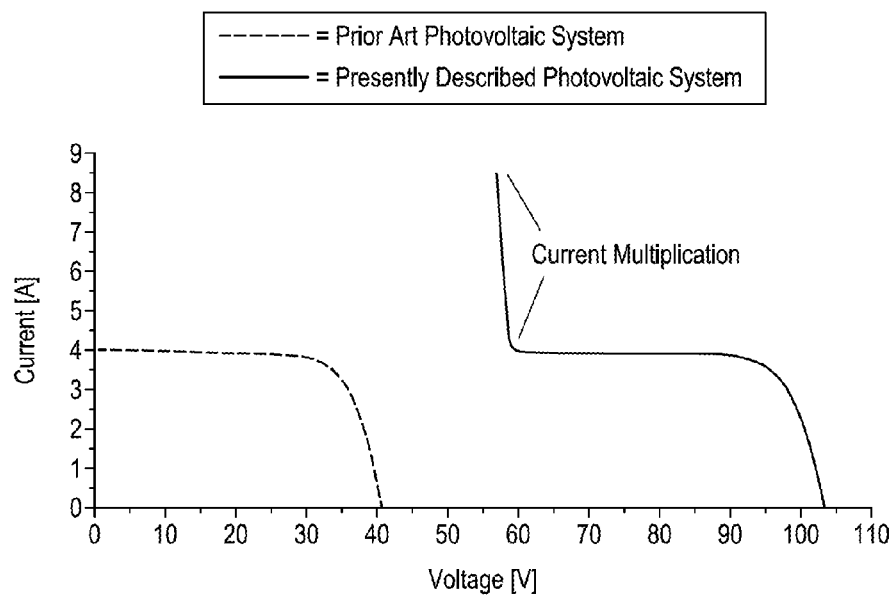
FIG. 4 is a graph showing current/voltage curves of a power generation system according to a prior art arrangement and an arrangement according to an embodiment of the present invention.
Figure 5:
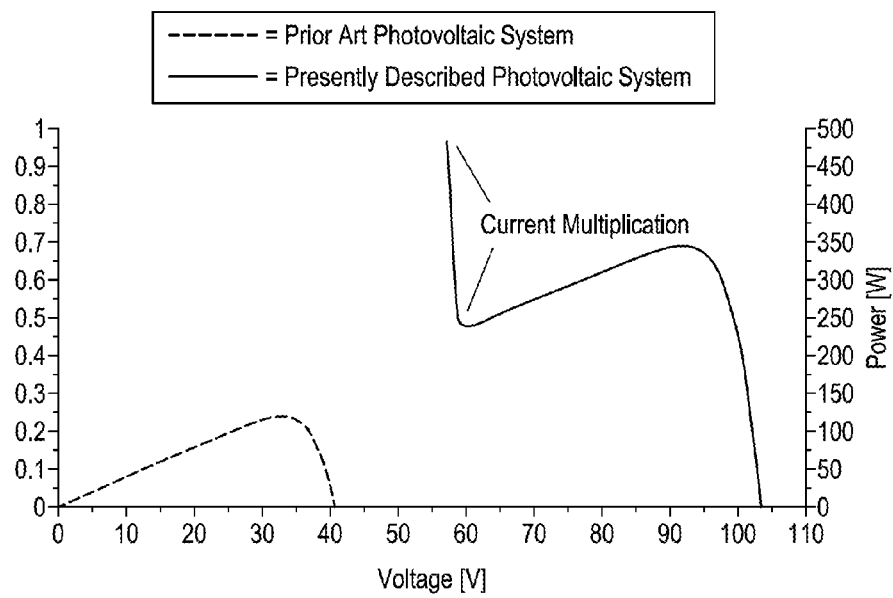
FIG. 5 is a graph showing power/voltage curves of a power generation system according to a prior art arrangement and an arrangement according to an embodiment of the present invention.

FIGS. 4 and 5 illustrate the current/voltage curves and power/voltage curves of the first and second arrangement of the second example of the present invention, set out above. In both FIGS. 4 and 5, the data from the prior arrangement (in accordance with FIG. 1) is shown by a dashed line, and the data from the arrangement of the present invention (in accordance with FIG. 2) is shown by a solid line.

From FIGS. 4 and 5 a new behaviour for the system is evident, as compared to the prior art arrangement of the power generation system. Looking first at FIG. 4, between approximately 60 V to 103 V the two power generation systems have a Power-Voltage (I-V) curve identical in shape, although the curve of the system of the present invention is shifted to a higher voltage range due to the presence of the voltage source 302. The $P_{max}$ of the arrangement of the present invention in the normal part of the I-V curve was 350 W (at 94 V), this compares to $P_{max}$ of 119 W at 33 volts for the prior art arrangement. This difference in $P_{max}$ can be explained by the increased voltage of the system.

However, below approximately 60 V the I-V curve of the arrangement of the present invention changes significantly from the prior art arrangement. The current increases linearly with decreasing voltage, i.e. the region labelled "Current Multiplication". This current increase allows the $P_{max}$ to shift to 482.58 W at 57 Volts (only limited experimentally by the I-V curve measuring system which could not handle currents higher than 10 A). The skilled person will appreciate that an aim of the invention is to ensure that, at least, the first photovoltaic device of the power generation system is biased at a voltage that is within the current multiplication region. In the present example, the "current multiplication region", and hence the predetermined level, is between approximately 57 Volts and 60 Volts. The skilled person will appreciate, that in the current multiplication region, power transfer of the power generation system is maximised. However, the predetermined level will vary for each system according to the invention.

Looking next at FIG. 5, the effect of the increased current and voltage on the power output of the power generation system 300 is evident. That is, the power generation system of the present invention has a power/voltage (P-V) curve identical in shape to that of the prior art arrangement, shifted to a significantly higher $P_{max}$. Below approximately 60 V the P-V curve of the second arrangement changes significantly, that is, the power increases linearly with decreasing voltage.

The new behaviour of the I-V/P-V curve of the power generation system 300 can be explained in the following way: In the prior art arrangement, each photovoltaic cell is biased at 0.5 V. In the present invention, an extra bias voltage is provided which extends the depletion region of the photovoltaic cells, and consequently reduces the capacitance of the photovoltaic cell. The extra active volume of the photovoltaic cells allows a linear increase of the generated photocurrent. This phenomenon is currently employed in photodiodes for radiation detection where the operating voltage (10 to 100 V) is much higher than 0.5 V of prior art photovoltaic generation systems, to allow for better photocurrent and higher signal to noise ratio.

The change in capacitance due to an applied reverse bias increases the electron and hole collection speed (the rise time), hence a higher current is produced. In the prior art arrangement, no bias is applied and thus the rise time is dominated by the diffusion time for diffused areas less than 5 mm², and by the RC time constant for larger diffused areas for all wavelengths of light. When the power generation system 300 is operated in the photoconductive mode (by an applied reverse bias), if the photovoltaic cells are fully depleted, the dominant factor affecting the rise time is the drift time. In non-fully depleted photodiodes, however, all three factors contribute to the rise time.

As the bias voltage increases in each of the photovoltaic cells, the speed of the electron-hole pairs formed in the photovoltaic cell increases, i.e. there is a resultant increase in the carrier mobility. Moreover, if the bias voltage reaches the "avalanche" voltage, then the current will further increase due to "impact ionization". Impact ionisation is the process where the charge carriers have gained sufficient energy that the carriers can interact with the lattice to create further electron-hole pairs (gain), through ejection of electrons from the lattice atoms. Avalanche breakdown typically occurs when a bias greater than 100 V is applied to each photovoltaic cell.

Therefore, the voltage source 302 can provide three functions. Firstly, the voltage source 302 raises the circuit voltage of the power generation system 300, which increases the power generated by the power generation system 300. Secondly, the voltage source 302 raises the bias voltage of at least the first photovoltaic device 301, which increases the depletion region of the photovoltaic device 301 and thus increases the output current of the photovoltaic device, which further increases the power generated by the power generation system 300. Thirdly, at sufficiently high bias voltages, impact ionisation can occur in the photovoltaic device 301, further increasing the output current.

Returning back to the maximum power transfer theorem, what we see in the I-V curve of FIG. 4 is the measured current of the power generation system 300 and the voltage drop across the external load resistor. To obtain the maximum power transfer, the resistance of the load must be equal to the resistance of the source, as viewed from the output terminals. This happens at approximately 93 Volts when the I-V curve follows the standard behaviour, i.e. between 60 Volts to 130 Volts.

Below 60 Volts the resistance of the load decreases and thus more voltage is applied across the resistance of the source (as a "Voltage Divider"). This in turn means that voltage is available to bias every single solar cell in the system, hence there is a linear increase in the current with a decreasing resistance of the load. In practice the internal resistance of the source decreases hence we have higher output currents below 60 Volts. Similarly, more points of maximum power transfer are evident below 58 Volts.

It is important to note that the same linear current increase takes place at low levels of light, e.g.: at 200 W/m$^2$, this means that even under low light conditions, the current output and power can still reach high levels in the power generation system 300.

The applicant recognises that when the load 304 draws more power from the power generation system 300 than the high current blocks 301 and 303 produce, the high voltage block 302 will contribute net power and thus the high voltage block's 302 power capacity will be reduced, eventually reducing the power available to be drawn from the system 300. Therefore, the present invention may run in two states, an equilibrium state and a non-equilibrium state.

In the equilibrium state, the power output from the voltage source 302 is balanced by the power input to the voltage source 302 from the photovoltaic device 303. In this operating state, the voltage source's 302 power capacity is not drained. The power produced by the power generation system 300 whilst in the equilibrium state is dependent on the incident flux of photovoltaic radiation and the characteristics of the power generation system 300.

In the non-equilibrium state, the power output from the voltage source 302 is not balanced by the power input to the voltage source 302 from the photovoltaic device 303. In this state, the voltage source 302 may be in a charge condition, or a discharge condition. The discharge condition allows the power generation system 300 to provide a temporary increase to the output power of the power generation system 300 by utilising the power capacity of the voltage source 302. However, as the voltage source 302 is drained, the output voltage will drop, decreasing the efficiency of the system. In this case, the power generation system 300 will reduce the power drawn from the system, resulting in the voltage source 302 entering an equilibrium or charge condition.

Figure 6:
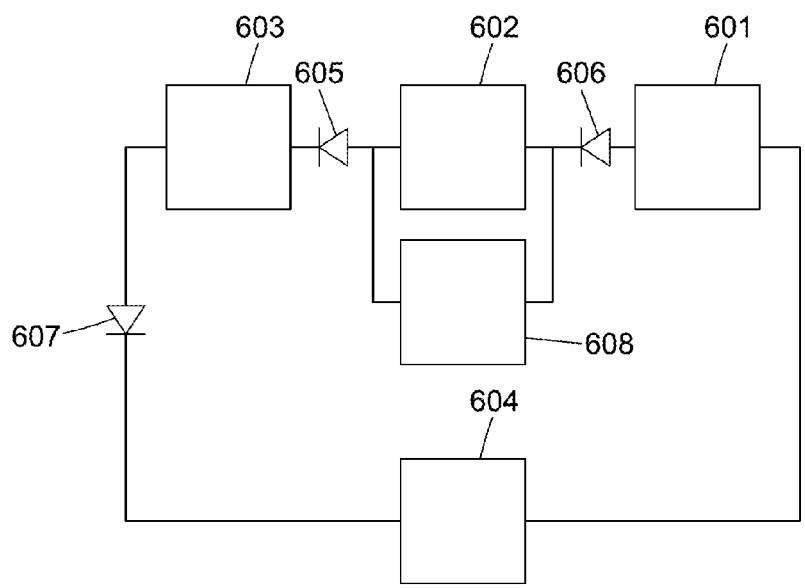
FIG. 6 is a schematic diagram of a power generation system in accordance with a further embodiment of the present invention.

A third embodiment of the invention will now be described with reference to FIG. 6. FIG. 6 comprises all of the features of the first and second embodiments. That is, FIG. 6 shows a schematic diagram of power generation system 600. The power generation system 600 has a first photovoltaic device 601. The first photovoltaic device 601 comprises one or more photovoltaic cells (not shown). In one configuration, when the first photovoltaic device 601 comprises two or more photovoltaic cells, the photovoltaic cells are connected in a parallel relationship. By connecting the photovoltaic cells in parallel the output current of the first photovoltaic device 601 is the sum of the currents of each photovoltaic cell in the first photovoltaic device 601. The skilled person will appreciate that the photovoltaic cells may also be connected in series, or any combination series-parallel thereof.

The power generation system 600 also has a voltage source 602. In this example, the voltage source 602 comprises one or more batteries. The one or more batteries may be fabricated using any type of state of the art battery technology, such as Lead-Sulphuric Acid, Nickel-Metal Hydride, Sodium-Nickel, or Lithium-ion. When the voltage source 602 comprises two or more batteries, the batteries are connected in a series relationship (n-type contact connected with p-type contact) in order to provide the maximum amount of voltage per unit area and weight. The skilled person will appreciated that the batteries may also be connected in parallel, or any combination series-parallel thereof. Batteries are ideal as they can provide a high voltage and have a very low resistance. It would be possible to replace the one or more batteries with any other electrical component capable of providing a high voltage with a low resistance, such as a capacitor.

The power generation system 600 also has a second photovoltaic device 603. The second photovoltaic device 603 comprises one or more photovoltaic cells (not shown). In this example, the electrical characteristics of the second photovoltaic device 603 are matched to the electrical characteristics of the first photovoltaic device 601. However, the skilled person would appreciate that the electrical characteristics of the photovoltaic devices 601 and 603 do not have to be matched in order to implement the invention. When the second photovoltaic device 603 comprises two or more photovoltaic cells, the photovoltaic cells are connected in a parallel relationship. By connecting the photovoltaic cells in parallel the output current of the second photovoltaic device 603 is the sum of the currents of each photovoltaic cell in the second photovoltaic device 603. The skilled person will appreciated that the photovoltaic cells may also be connected in series, or any combination series-parallel thereof.

The first photovoltaic device 601 is coupled to the voltage source 602 and one side of a load 604. The voltage source 602 is coupled to the first photovoltaic device 601 and the second photovoltaic device 603. The second photovoltaic device 603 is coupled to the voltage source 602 and the second side of the load 604. Therefore, in this arrangement the load 604 is arranged such that it can be supplied electrical power by the power generation system 600. The load 604 may be any suitable device such as an inverter, an electric motor or any other electrical device.

The first photovoltaic device 601, the voltage source 602 and the second photovoltaic device 603 are coupled to the load 604 through a series of diodes 605, 606 and 607. The voltage source 602 is coupled to the first photovoltaic device 601 through diode 606, and is coupled to the second photovoltaic device 603 through diode 605. The second photovoltaic device 603 is connected to one side of the load through diode 607. In this example, the diodes are arranged to allow current to flow only from the second photovoltaic device 603 to the voltage source 602, from the voltage source 602 to the high current block 601, and from the high current block 601 to the load 604.

As the power generation system 600 enters the current multiplication region shown in FIG. 4, it is possible that the current of the system will rapidly increase to a level damaging to one or more electrical components of the power generation system 600. Therefore, the diodes 605 to 607 are arranged to limit the current in the power generation system 600 to prevent component damage from overcurrent conditions.

In prior art power generation systems, diodes are a standard component in photovoltaic modules, where they are typically rated at 15 A. As the power generation system 600 is arranged to produce higher currents, the diodes 605 to 607 must be capable of handling higher currents. The specific electrical characteristics of the diodes 605 to 607 have to be tailored for each arrangement of the power generation system 600. The diodes 605 to 607 are rated to, at least, the maximum current that the power generation system 600 operates at. However, the selection of the requisite diode characteristics is well within the knowledge of the skilled person in the art and will therefore be discussed no further.

The power generation system 600 further comprises a power regulator 608. The power regulator 608 is arranged to adjust the power output of the power generation system 600. The power regulator 608 may achieve this by any common power adjustment technique, such as adding a variable resistance or removing the load from the system. Preferably, the power regulator 608, adjusts the power of the power generation system 600 by adjusting the power output of the voltage source 602. Adjusting the power output of the voltage source 602 will alter the circuit voltage of the power generation system 600. Moreover, adjusting the power output of the voltage source 602 will also alter the bias voltage of, at least, the first photovoltaic device 601, which will in turn alter the output current of the first photovoltaic device 601. Therefore, adjusting the power output of the voltage source 602 can dramatically adjust both the voltage and current of the power generation system, which allows for easy regulation of the output power of the system.

The power regulator 608 may be further arranged to act as a power monitor. The power regulator 608 may monitor any electrical characteristic of the power generation system 600, such as the voltage, the current or the resistance of the power generation system. For every arrangement of the power generation system of the present invention, there is a load that maximizes the power while limiting the maximum current in the circuit. The power monitor 608 is arranged to finding the optimal load for maximum power transfer whilst limiting the current to a level every component of the power generation system can handle.

The second and third embodiment of the power generation system described herein may operate in either an equilibrium, or non-equilibrium state. In an equilibrium state, the power regulator 608 is arranged to balance the power output from the voltage source 602 and the power supplied to the voltage source 602 from the second photovoltaic device 603. Thus, if the power regulator 608 detects the power supplied to the voltage source 602 is less than the power supplied to the first photovoltaic device, the power regulator 608 decreases the power output of the voltage source 602. Similarly, if the power regulator 608 detects the power supplied to the voltage source 602 is greater than the power supplied to the first photovoltaic device, the power regulator 608 increases the power output of the voltage source 602.

The applicant recognises that in some circumstances, the power generation system 600 would preferably be run in a non-equilibrium mode. If, for example, the voltage source 602 had been overly discharged, the power regulator 608 may decrease and maintain the power output from the voltage source 602 below the level of the power supplied to the voltage source 602. Similarly, if the voltage source 602 is in an overcharge condition, the power regulator 608 may increase and maintain the power output from the voltage source 602 above the level of the power supplied to the voltage source 602. Moreover, in some circumstances, it may be preferable to provide a temporary increase in the output of the power generation system, which could be arranged by the power regulator 608 increasing and maintaining the power output from the voltage source 602 above the level of the power supplied to the voltage source 602.

The power monitoring functions of the power regulator 608 may, for example, be performed by a commercially available Inverter. Most common commercial inverters feature current, voltage and power monitoring. Furthermore, most common commercial inverters could be easily adapted by the person skilled in the art to control the power generation system 600 of the present invention. Therefore, the control circuitry of the power generation system 600 will not be discussed further.

This arrangement of the power generation system 600 displays the following electrical characteristics:

the Open Circuit Voltage $V_{oc}$ is the sum of the Open Circuit Voltage $V_{oc}$ of the first photovoltaic device 601, the voltage source 602 and the second photovoltaic device 603;

the Short Circuit Current $I_{sc}$ of the system is equal to the characteristic Short Circuit Current $I_{sc}$ of one of the first photovoltaic device 601 or the second photovoltaic device 603 when measured alone.

In the examples described herein, one or two photovoltaic devices have been described in order to illustrate the present invention. The skilled reader will understand that the present invention could significantly increase to any number of photovoltaic devices. In fact, a significant advantage of the present invention is the ease of scaling up the power generation system described herein. The illustrative examples have been provided only to aid the skilled reader and should not be read as restrictive to the scope of the invention.

The invention claimed is:

1. A power generation system comprising:
   a first photovoltaic device; and
   a voltage source, coupled to the first photovoltaic device, wherein the voltage source is arranged to supply electrical power to the first photovoltaic device to increase the bias voltage of the first photovoltaic device thereby increasing the overall power output of the power generation system; and
   wherein the voltage source is arranged to reverse bias the first photovoltaic device such that the width of the depletion region of the first photovoltaic device is increased.

2. The power generation system of claim 1, wherein the voltage source is further arranged to maintain the bias voltage of the first photovoltaic device at a predetermined level thereby maintaining an increased power output of the power generation system.

3. The power generation system of claim 2, wherein the predetermined level is the bias voltage which maximises the power transfer of the power generation system.

4. The power generation system of claim 1, further comprising:
   a second photovoltaic device, coupled to the voltage source, wherein the second photovoltaic device is arranged to supply electrical power to the voltage source.

5. The power generation system of claim 1, further comprising:
   a power regulator, coupled to the voltage source, wherein the power regulator is arranged to adjust the output power of the power generation system by adjusting the output of the voltage source.

6. The power generation system of claim 5, wherein the power regulator is further arranged to monitor the power supplied to the voltage source from the second photovoltaic device.

7. The power generation system of claim 6, wherein the power regulator is further arranged to decrease the power output from the voltage source upon detecting that the power output from the voltage source is higher than the power supplied from the second photovoltaic device.

8. The power generation system of claim 6, wherein the power regulator is further arranged to increase the power output from the voltage source upon detecting that the power output from the voltage source is lower than the power supplied from the second photovoltaic device.

9. The power generation system of claim 6, wherein the power regulator is further arranged to decrease the power output from the voltage source below the level of the power supplied from the second photovoltaic device upon detecting the voltage source needs to be charged.

10. The power generation system of claim 6, wherein the power regulator is further arranged to increase the power output from the voltage source above the level of the power supplied from the second photovoltaic device upon detecting the voltage source is overcharged.

11. The power generation system of claim 1, further comprising:
 a diode, coupled between the first photovoltaic device and the voltage source, wherein the diode is arranged to protect the voltage source from an overcurrent condition.

12. The power generation system of claim 1, wherein the voltage source is a battery or a capacitor.

13. The power generation system of claim 1, wherein the voltage source is located remotely from the first photovoltaic device and/or the second photovoltaic device.

* * * * *

UNITED STATES PATENT AND TRADEMARK OFFICE
CERTIFICATE OF CORRECTION

| | |
|---|---|
| PATENT NO. | : 10,033,191 B2 |
| APPLICATION NO. | : 15/242715 |
| DATED | : July 24, 2018 |
| INVENTOR(S) | : Arnaldo Galbiati |

Page 1 of 1

It is certified that error appears in the above-identified patent and that said Letters Patent is hereby corrected as shown below:

On the Title Page

Column 1, item (71) Applicant should read:
"SOLARIS PHOTONICS LTD".

Signed and Sealed this
Second Day of October, 2018

Andrei Iancu
*Director of the United States Patent and Trademark Office*